United States Patent
Murakami et al.

(10) Patent No.: US 8,787,021 B2
(45) Date of Patent: Jul. 22, 2014

(54) MEMORY COOLER

(75) Inventors: Vance B. Murakami, Los Gatos, CA (US); Harold Z. Htutt, San Jose, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 427 days.

(21) Appl. No.: 13/163,369

(22) Filed: Jun. 17, 2011

(65) Prior Publication Data
US 2012/0320523 A1 Dec. 20, 2012

(51) Int. Cl.
*H05K 7/20* (2006.01)
*F28F 7/00* (2006.01)
*G06F 1/20* (2006.01)

(52) U.S. Cl.
CPC .............. *H05K 7/20154* (2013.01); *G06F 1/20* (2013.01); *F28F 7/00* (2013.01); *H05K 7/20* (2013.01)
USPC .......... 361/704; 165/80.3; 165/185; 361/715; 361/719; 361/720; 361/697

(58) Field of Classification Search
CPC .. H05K 7/20154; H05K 7/20509; G06F 1/20; H01L 23/3672; H01L 23/3677
See application file for complete search history.

(56) References Cited

U.S. PATENT DOCUMENTS

| | | | | |
|---|---|---|---|---|
| 5,975,194 A | * | 11/1999 | Wagner | 165/80.3 |
| 6,466,444 B2 | * | 10/2002 | Cheung | 361/703 |
| 6,552,902 B2 | * | 4/2003 | Cho et al. | 361/704 |
| 8,081,474 B1 | * | 12/2011 | Zohni et al. | 361/719 |
| 8,537,554 B1 | * | 9/2013 | Hockaday | 361/713 |
| 2007/0193718 A1 | * | 8/2007 | Carter et al. | 165/80.3 |
| 2008/0089034 A1 | * | 4/2008 | Hoss et al. | 361/721 |

OTHER PUBLICATIONS

"Thermodynamic RAM Cooler for Overclockers," Arctic RC Pro, Artic Cooling, Swiss Low Noise Cooling Solution, Press Release, Oct. 29, 2009, 1 page.
"Installation of Artic RC Pro," Arctic RC Pro Installation Instructions, 2009, 1 page.
"Heat Sinks for Natural Convection>Overview," Cool Innovations, Advanced Heat Sinks, downloaded on Jun. 8, 2011 from coolinnovations.com/.../overview, pp. 1-6.

* cited by examiner

Primary Examiner — Gregory Thompson

(57) ABSTRACT

A cooler for a memory module includes heat plates on the sides of the memory module and heat fins extending from the top of the heat plates. The heat fins are optimized according to simulated or actual airflow about the memory module inside an enclosure. The heat fins may curve diagonally outward from the memory module and their free ends may be arranged substantially parallel to the airflow so air flows over their larger lateral surfaces down to the memory module.

16 Claims, 11 Drawing Sheets

US 8,787,021 B2

MEMORY COOLER

FIELD OF INVENTION

This invention relates to coolers, heat spreaders, and heat sinks for memory modules.

DESCRIPTION OF RELATED ART

A memory cooler pulls heat away from a memory module to improve performance and reliability. A simple memory cooler may be a heat spreader mounted to memory chips on a memory module. A more complicated memory cooler may include a heat pipe with a working fluid that carries heat away from the heat spreader to fins located above the memory module. Furthermore, a fan may be mounted directly above the fins to move air through the fins.

SUMMARY

In one or more embodiments of the present disclosure, a cooler for a memory module in an enclosure includes a heat plate and heat fins. The heat plate has a top edge and an interior side. The interior side is to be thermally coupled to an exterior side of the memory module. The heat fins are configured according to the airflow, simulated or actual, in the enclosure. In one or more embodiments, the heat fins extend upward from the top edge and curve diagonally away from the heat plate. The heat fins may be arranged in increasing diagonal reach along the top edge of the heat plate.

BRIEF DESCRIPTION OF THE DRAWINGS

In the drawings.

Use of the same reference numbers in different figures indicates similar or identical elements.

DETAILED DESCRIPTION

Components on a printed circuit board are placed as close as possible to efficiently utilize the board space and this can cause thermal issues at the component level. The problem is compounded for memory modules because they are generally placed in a row close to the central processing unit (CPU) and other chipsets that generate large amounts of heat. Furthermore, the memory modules located in the middle of the row or furthest away from the cooling air may have thermal issues.

Figure 1:
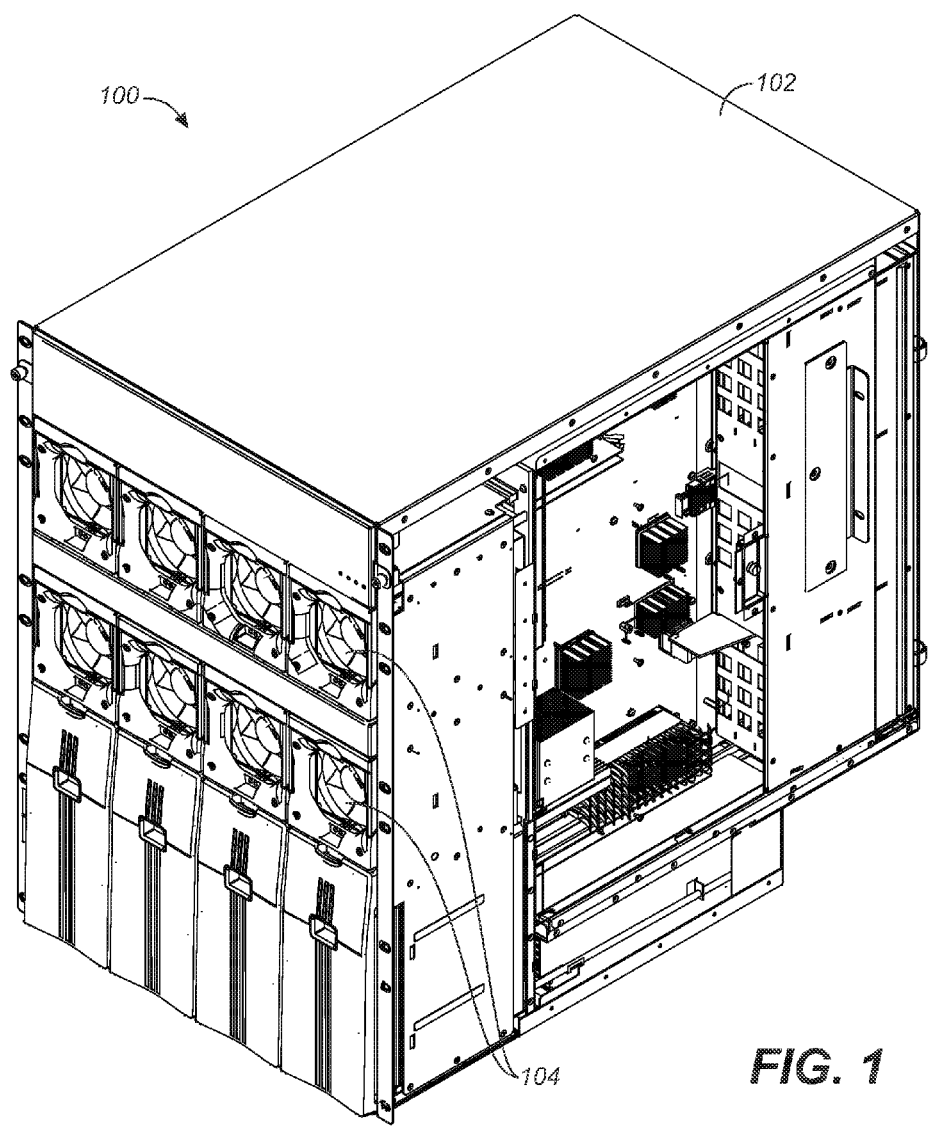
FIG. 1 illustrates an isometric view of a computer system with an enclosure in one or more embodiments of the present disclosure.

FIG. 1 illustrates an isometric view of a computer system 100 with an enclosure 102 in one or more embodiment of the present disclosure. Part of enclosure 102 is shown in phantom to reveal the inside of computer system 100. Computer system 100 includes fans 104 (only two are labeled) that push air from the front to the back of enclosure 102. Other fan configurations may be used, including fans at the back that work alone or in conjunction with fans 104 to pull air out from enclosure 102.

Figure 2:
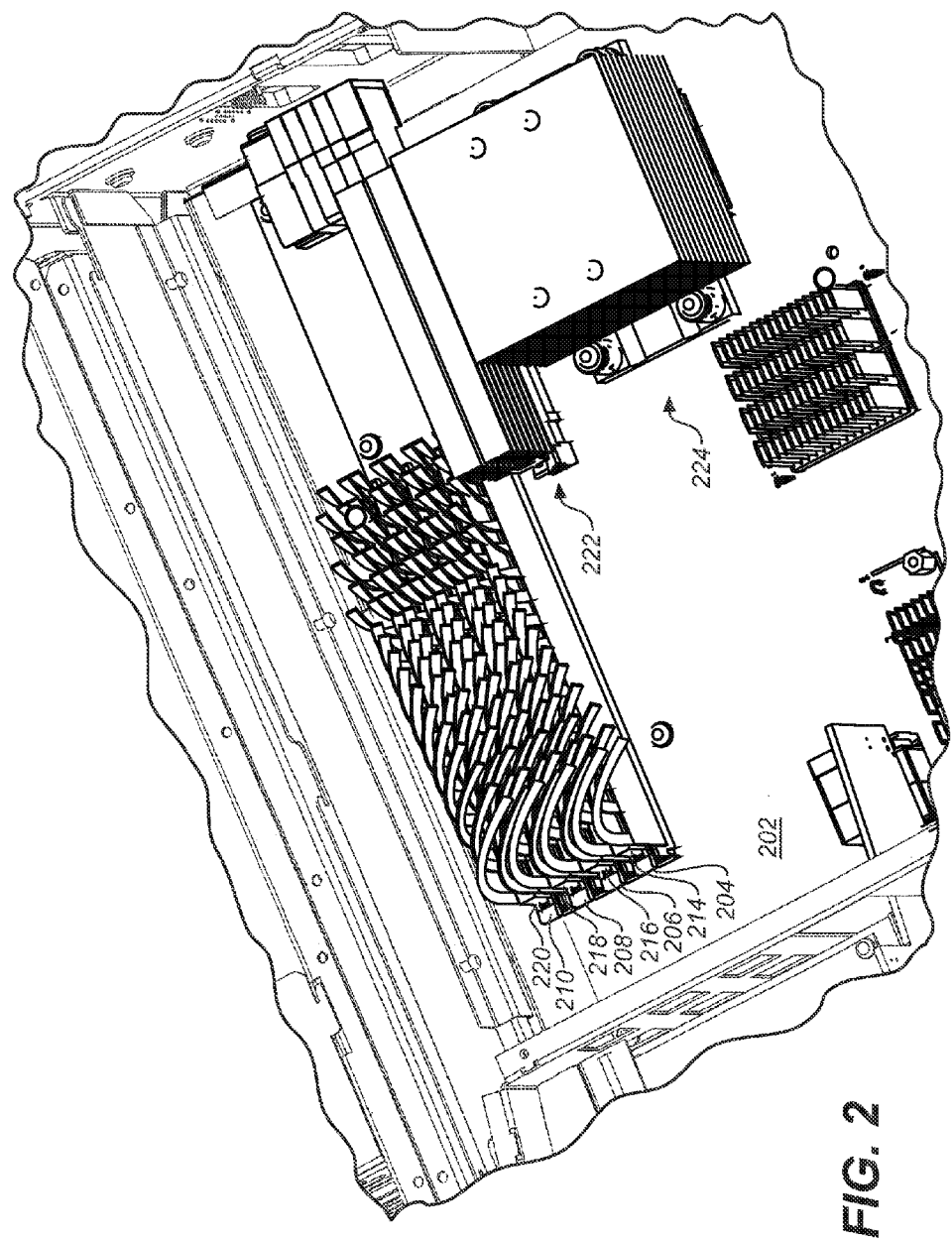
FIG. 2 illustrates an enlarged isometric view of the computer system of FIG. 1 in one or more embodiments of the present disclosure.

FIG. 2 illustrates an enlarged isometric view of computer system 100 in one or more embodiments of the present disclosure. Computer system 100 includes a printed circuit board (PCB) 202 with a row of memory slots 204, 206, 208, and 210, memory modules 214, 216, 218, and 220 in the memory slots, a voltage regulator module (VRM) 222 on the PCB adjacent to the memory modules, and a CPU 224 on the PCB adjacent to the VRM. In one or more embodiments, memory modules 214, 216, 218, and 220 are dual-inline memory modules (DIMMs), and the memory slots are DIMM slots. Each memory module includes memory chips, such as dynamic random access memory (DRAM) chips, mounted on one or both sides of a printed circuit board. Each memory module may also include one or more heat spreaders mounted to the memory chips.

Figure 3:
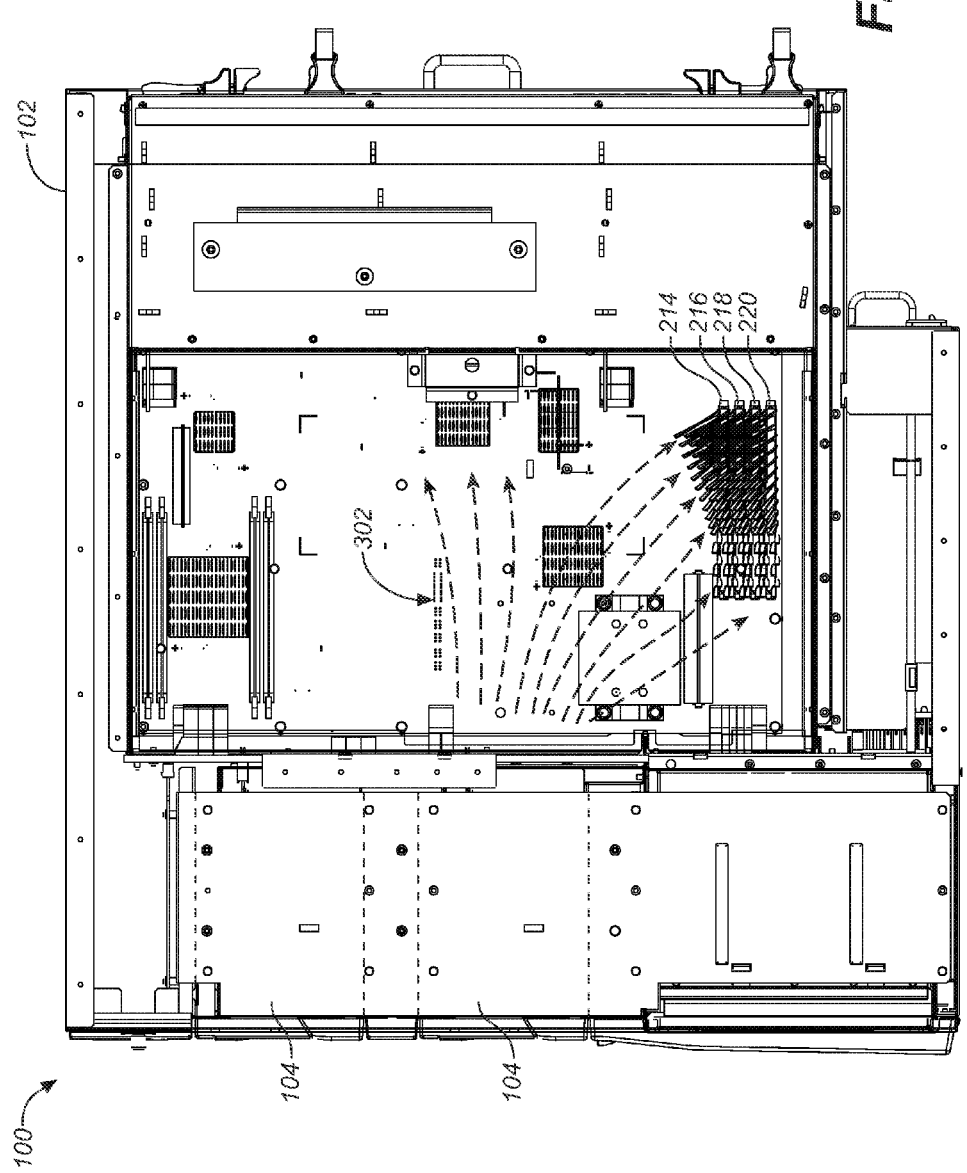
FIG. 3 shows a side view of the computer system of FIG. 1 in one or more embodiments of the present disclosure.
Figure 4:
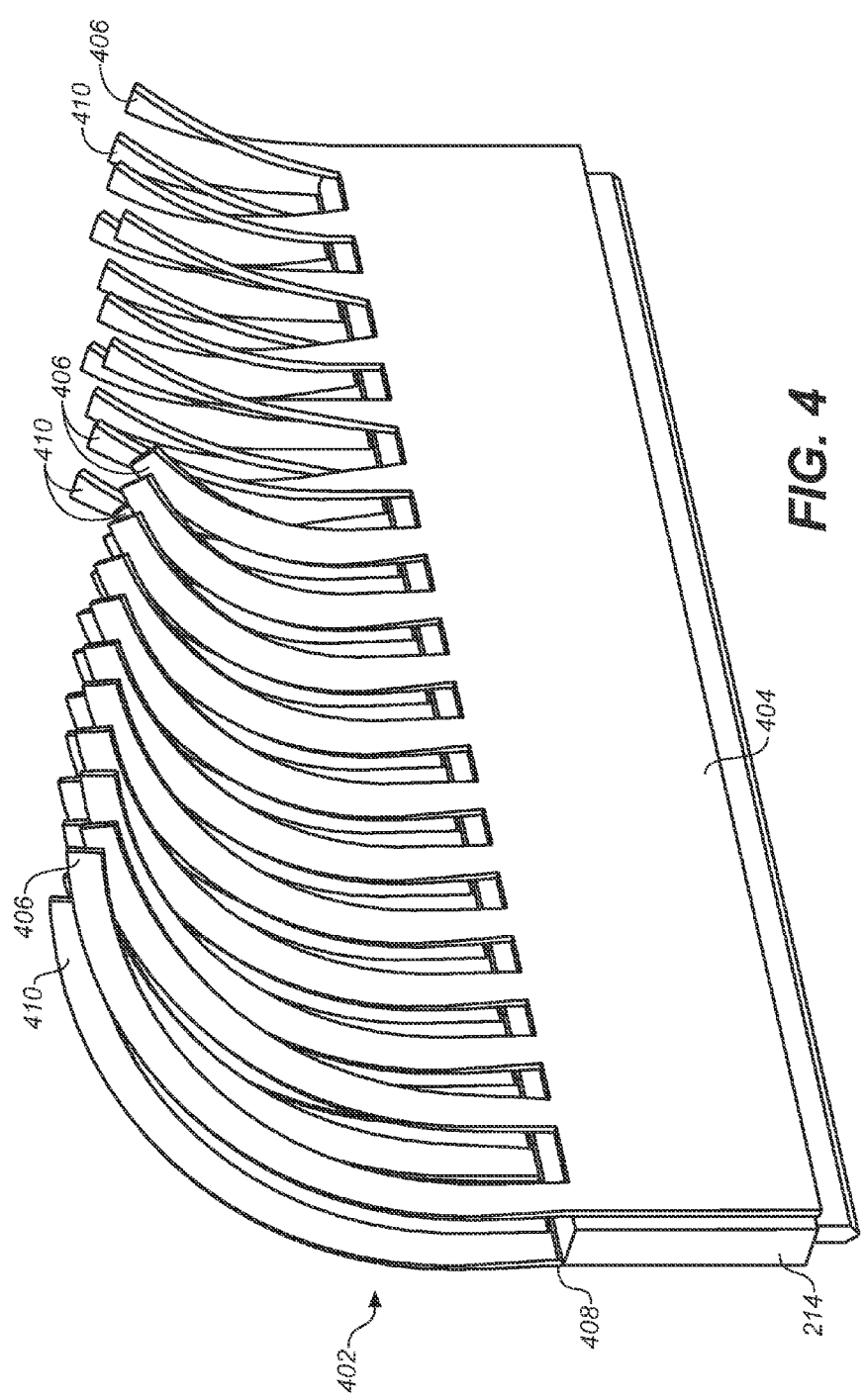
FIGS. 4, 5, 6, and 7 respectively illustrate isometric, front, top, and side views of a memory cooler mounted on a memory module in the computer system of FIG. 1 in one or more embodiments of the present disclosure.
Figure 5:
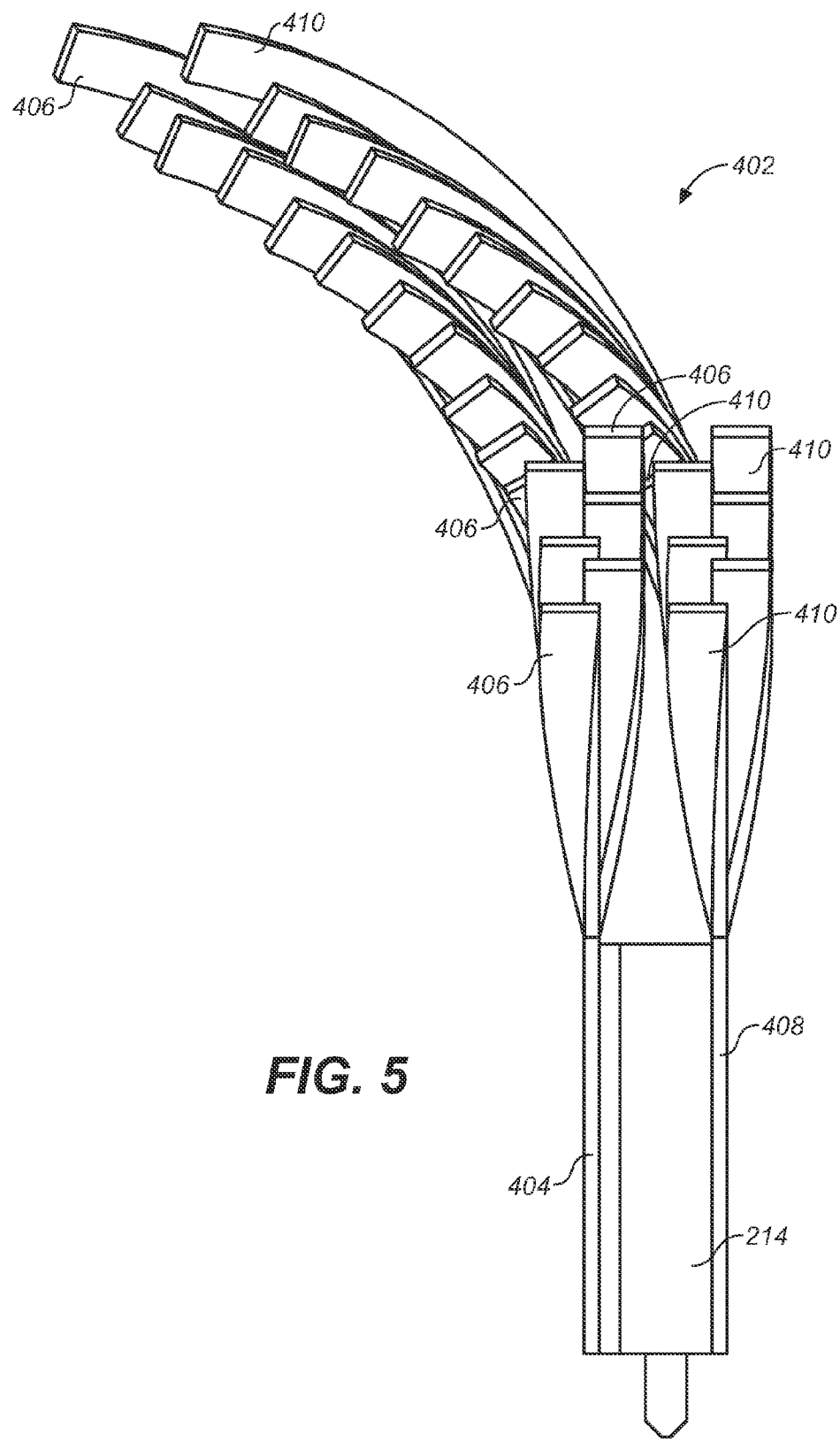

FIG. 3 shows a side view of computer system 100 in one or more embodiments of the present disclosure. The closet fan 104 to memory modules 214, 216, 218, and 220 creates a pattern of airflow 302 in enclosure 102. Airflow 302 may be determined by simulation or by testing.

FIGS. 4, 5, 6, and 7 respectively illustrate isometric, front, top, and side views of a memory cooler 402 mounted on memory module 214 in one or more embodiments of the present disclosure. Memory cooler 402 includes a heat plate 404, a row of heat fins 406 (only some are labeled) extending from heat plate 404, a heat plate 408, and a row of heat fins 410 (only some are labeled) extending from heat plate 408.

Heat plate 404 is a rectangular sheet of thermally conductive material, such as aluminum or copper. The interior side of heat plate 404 is thermally coupled to a corresponding exterior side of memory module 214. The thermal coupling may be direct or indirect through an intermediary such as a thermal pad or thermal grease. The exterior side of memory module 214 refers to exterior surfaces of the memory chips or a heat spreader mounted to the memory chips. Heat plate 404 is fixed adhesively or mechanically to memory module 214.

Heat fins 406 are strips of thermally conductive material, such as aluminum or copper. Heat fins 406 have rectangular cross-sections. Heat fins 406 extend upward from the top edge of heat plate 404. Heat fins 406 are spaced apart along the top edge of heat plate 404. Heat fins 406 are arranged in increasing length from the front to the back of the top edge of heat plate 404. The front refers to the end of heat plate 404 that is closest to a fan 104. Heat fins 406 are curved and twisted at least along part of their lengths. The exact configuration of heat fins 406 is optimized for heat dissipation based on airflow 302 (FIG. 3) in enclosure 102.

Figure 6:
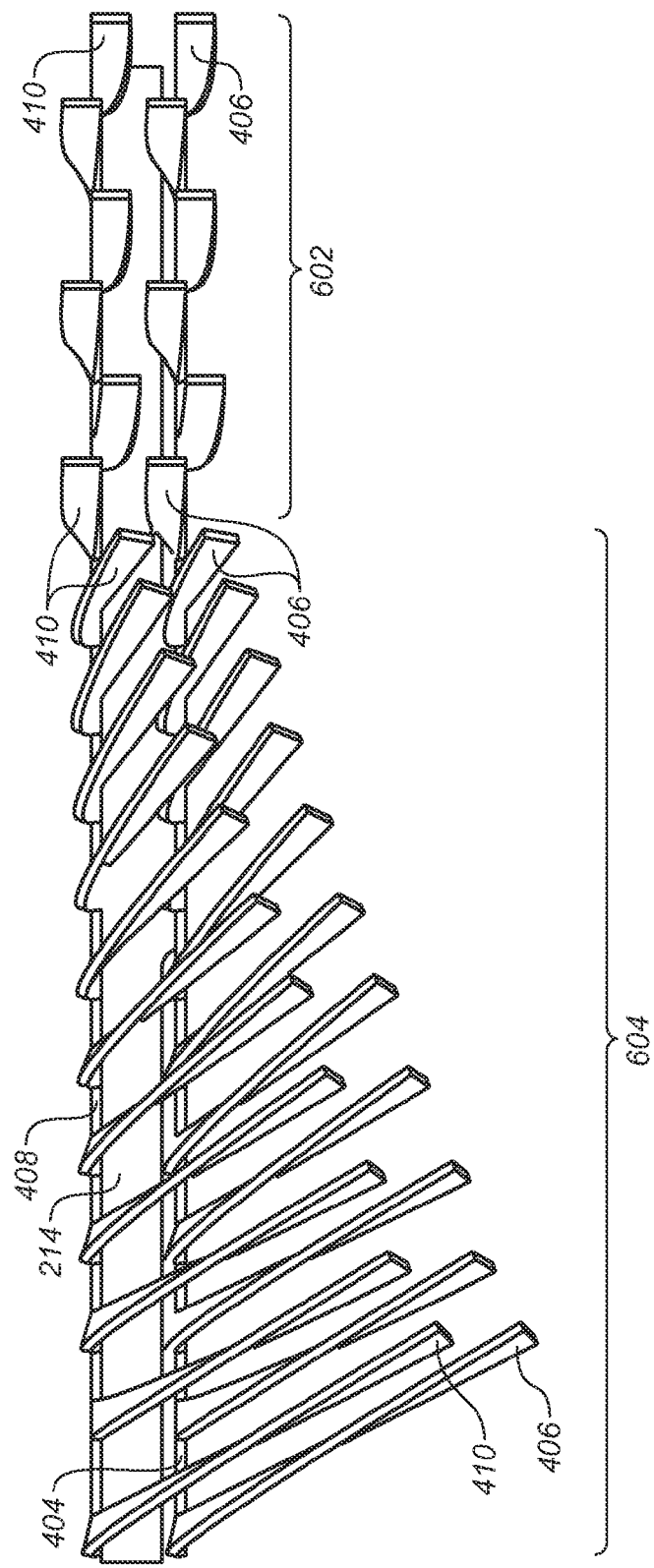
Figure 7:
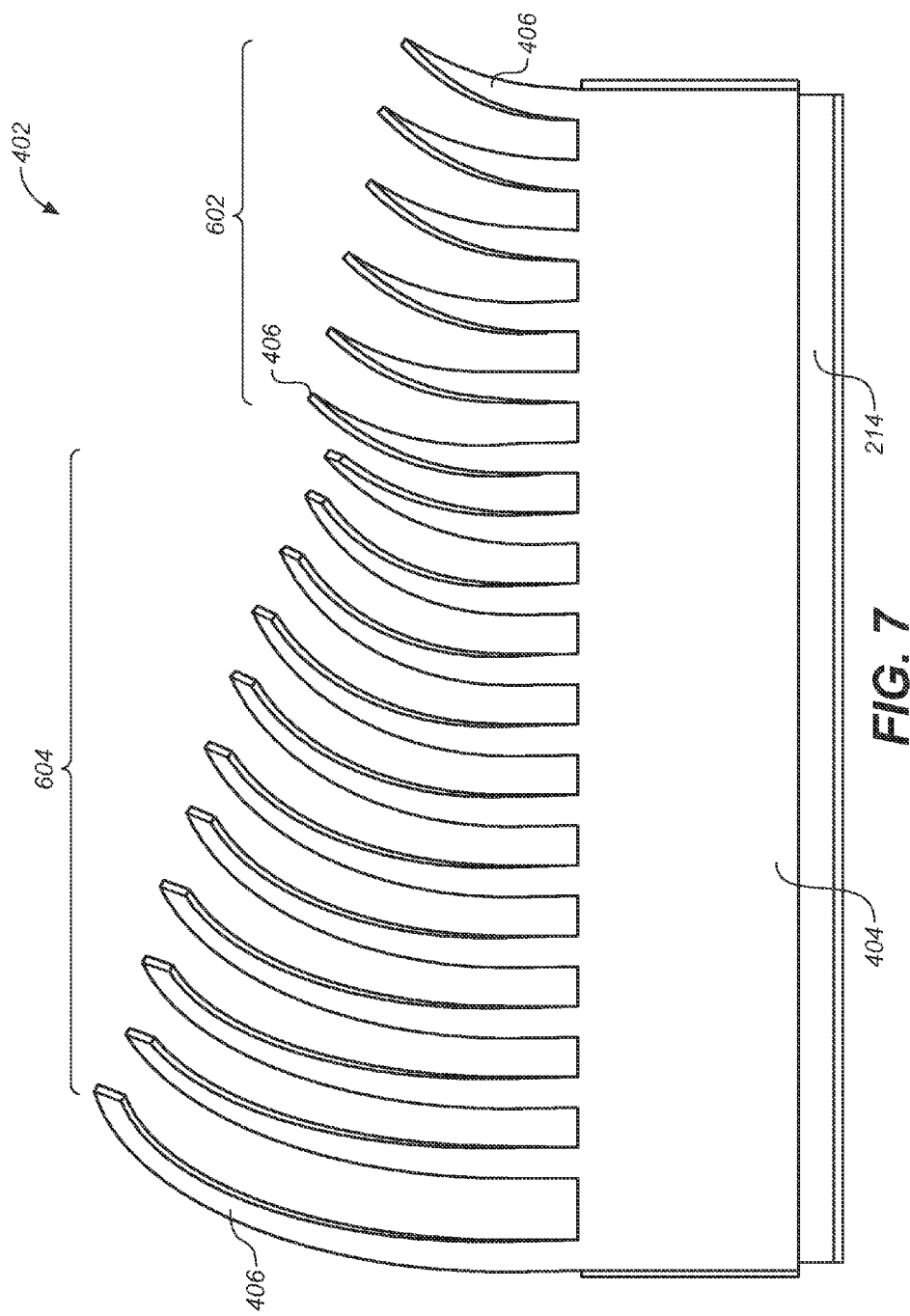

In one or more embodiments, a first set 602 (FIG. 6) of heat fins 406 curve forward along the length of heat plate 404. Heat fins 406 in the first set 602 increase in height along the length of heat plate 404. Heat fins 406 in the first set 602 are twisted in the same direction, e.g., counterclockwise, so their free ends and as much of their surface area as possible are substantially parallel to airflow 302 in enclosure 102. Consecutive heat fins 406 in the first set 602 are also laterally offset along the heat plate 404 as seen in FIG. 6.

In one or more embodiments, a second set 604 (FIG. 6) of heat fins 406 follows the first set 602 (FIG. 6) of heat fins 406 along heat plate 404. The second set 604 of heat fins 406 curve diagonally away from heat plate 404. For example, heat fins 406 of the second set 604 curve forward and outward from heat plate 404. Heat fins 406 in the second set 604 increase in height and diagonal reach along the length of heat plate 404. Heat fins 406 in the second set 604 are twisted in the same direction, e.g., clockwise, so their free ends and as much of their surface area as possible are substantially parallel to airflow 302 (FIG. 3) in enclosure 102.

Heat plate 404 and heat fins 410 are of the same or similar construction as heat plate 404 and heat fins 406. Heat fins 410 are arranged in the same orientation so they are parallel to heat fins 406.

Figure 8:
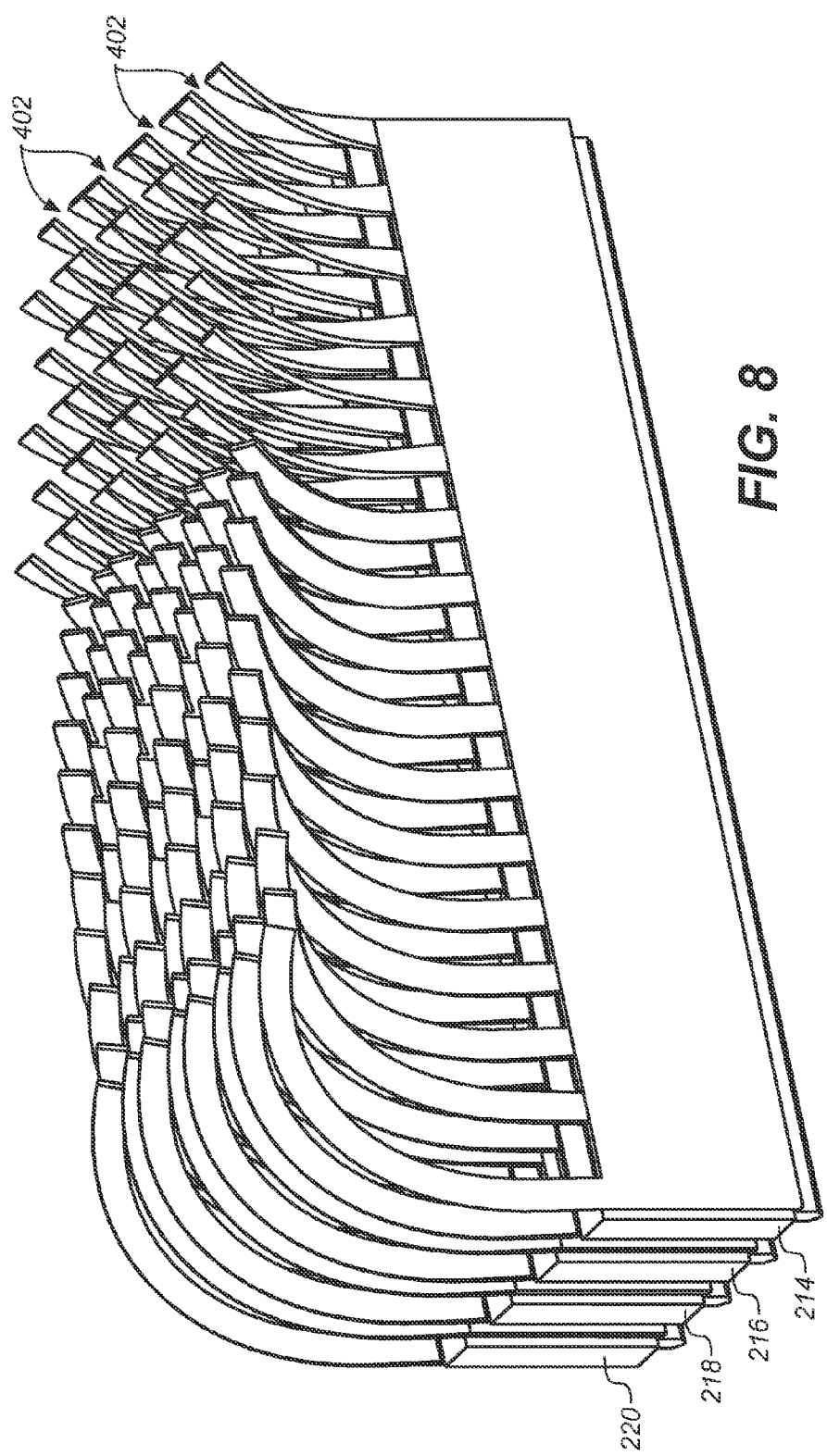
FIGS. 8, 9, and 10 respectively illustrate isometric, front, and top views of memory coolers mounted on memory modules in the computer system of FIG. 1 in one or more embodiments of the present disclosure.
Figure 9:
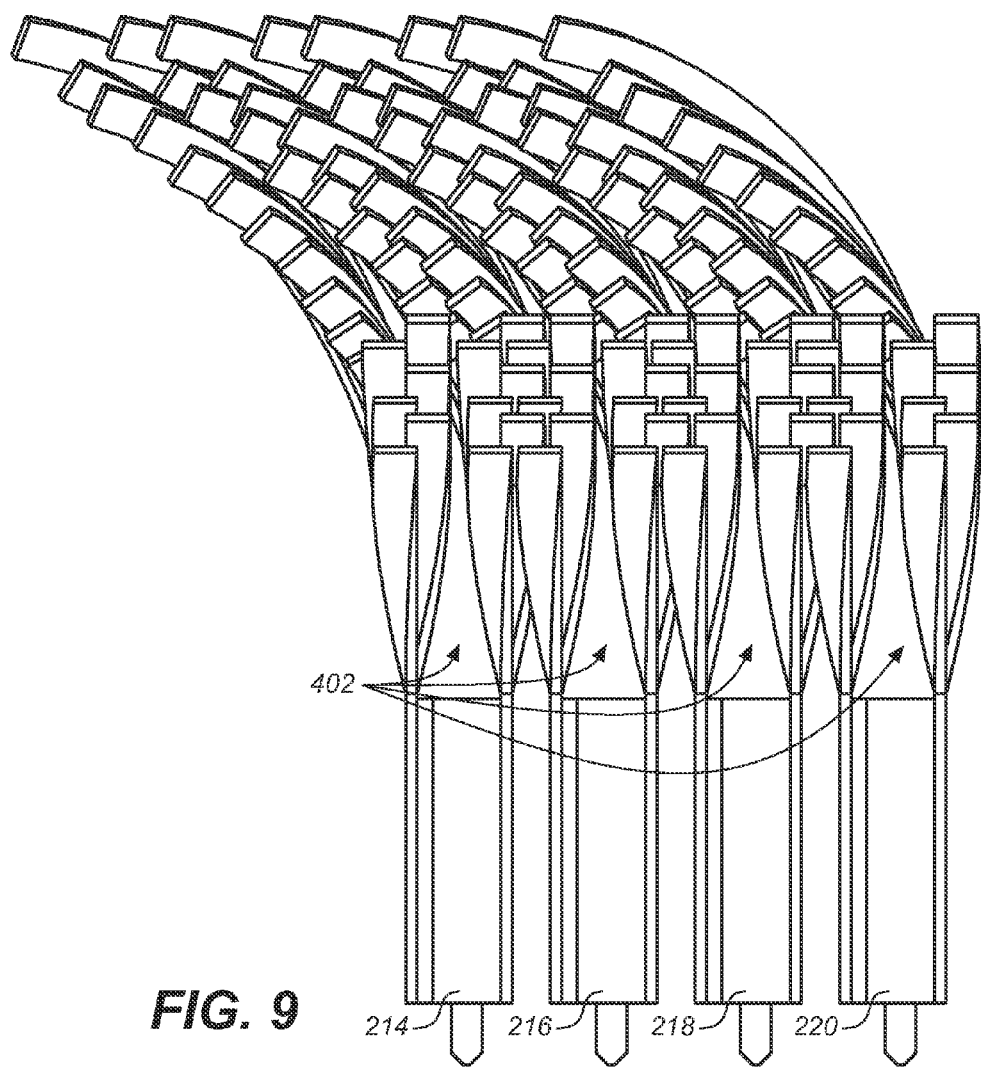
Figure 10:
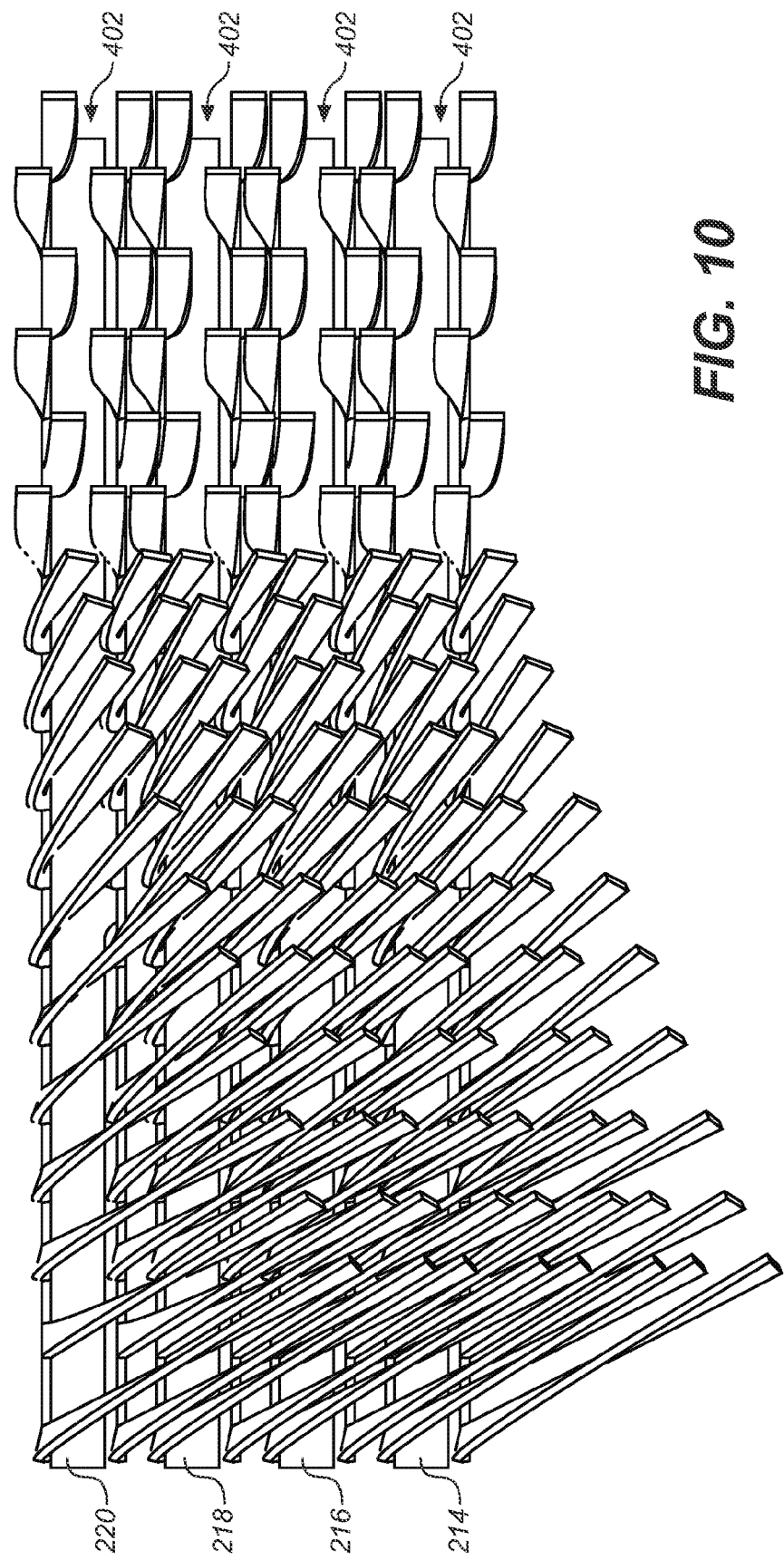

FIGS. 8, 9, and 10 illustrate isometric, front, and top views of memory coolers 402 mounted on memory modules 214, 216, 218, and 220 in one or more embodiments of the present disclosure. Although the same design is shown for all memory coolers 402, each memory cooler may be optimized according to airflow 302 (FIG. 3) in enclosure 102.

As can be seen, the free ends of the heat fins are offset from each other due to their increasing height and diagonal reach so they do not block each other from airflow 302 (FIG. 3) in enclosure 102. This allows the heat fins to be exposed to more air for better cooling. The free ends of the heat fins are substantially parallel to airflow 302 so they do not impede the airflow. The curvatures of the heat fins guide the air along their larger lateral surfaces down to memory modules 214, 216, 218, and 220 for better cooling. As some heat fins are curved away from memory modules 214, 216, 218, and 220, they reach into portions of airflow 302 not immediately adjacent to the memory modules.

Figure 11:
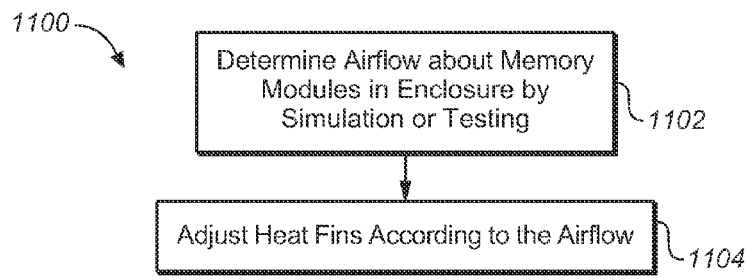
FIG. 11 illustrates a method for arranging heat fins of memory coolers in one or more embodiments of the present disclosure.

FIG. 11 is a flowchart of a method 1100 for arranging the heat fins of coolers 402 (FIG. 8) in one or more embodiment of the present disclosure. Method 1100 may include one or more operations, functions or actions as illustrated by one or more of blocks. The various blocks may be combined into fewer blocks, divided into additional blocks, and/or eliminated based upon the desired implementation. Method 1100 may be performed with the aid of a computer. Method 1100 may begin in block 1102.

In block 1102, airflow 302 about the memory modules 214, 216, 218, and 220 in enclosure 102 is determined. Airflow 302 may be determined by computer simulation or testing.

In block 1104, the heat fins of coolers 402 for memory modules 214, 216, 218, and 220 are adjusted for airflow 302. The heat fins are curved and twisted so their free ends are parallel airflow 302 and their lateral surfaces would bring the simulated airflow down to the memory modules. As described above, the heat fins may be arranged in increasing height and diagonal reach, and the free ends are offset so they do not block each other from airflow 302 in enclosure 102.

Figure 12:
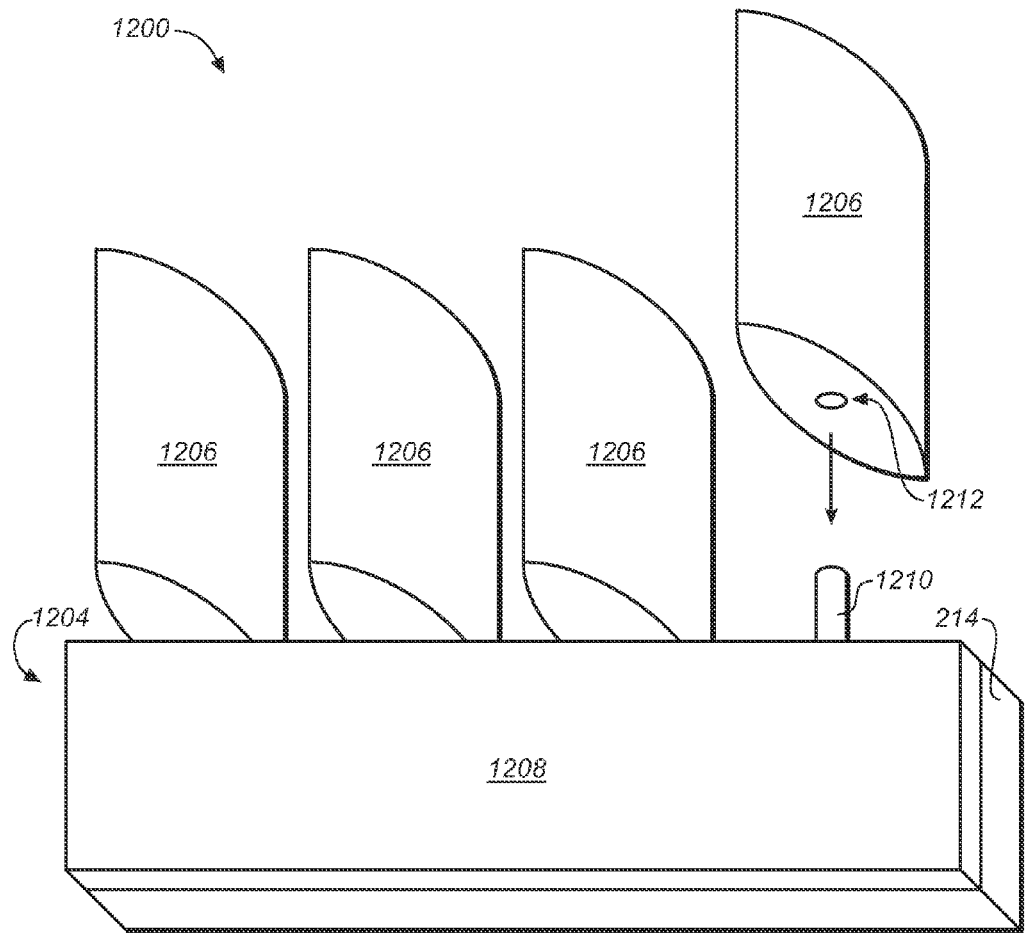
FIG. 12 illustrates an isometric view of a self-adjusting memory cooler in one or more embodiments of the present disclosure.

FIG. 12 illustrates an isometric view of a self-adjusting memory cooler 1200 mounted on memory module 214 in enclosure 102 (FIG. 1) in one or more embodiments of the present disclosure. Memory cooler 1200 includes a heat plate 1204 and heat fins 1206 rotatably mounted along the top of the heat plate.

Heat plate 1204 includes a rectangular block 1208 and pins 1210 extending from the top edge of the rectangular block. Heat plate 1204 and heat fins 1206 are made of thermally conductive material, such as aluminum or copper. The interior side of heat plate 1204 is thermally coupled to a corresponding exterior side of memory module 214. The thermal coupling may be direct or indirect through an intermediary such as a thermal pad or thermal grease. Heat plate 1204 is fixed adhesively or mechanically to memory module 214.

Each heat fin 1206 is an airfoil with a bottom bore 1212 for receiving a pin 1210 on heat plate 1204 so heat fin 1206 can freely rotate. Thermal grease may be added to pins 1210 and bores 1212 to reduce friction and increase thermal conductivity. Although heat fins 1206 are illustrated as of the same dimensions, they may vary in length and cross-section.

As heat fins 1206 are freely rotatable airfoils, they self-align along the direction of the airflow 302 (FIG. 3) within enclosure 102 (FIG. 3) so their surfaces are parallel to the airflow to improve the cooling of memory module 214. This is particularly helpful when one of the cooling fans fails and airflow 302 changes. Memory cooler 1200 then re-aligns itself so the fin surfaces are parallel to the new airflow so the cooling of memory module 214 is less impacted by the failing cooling fan.

Various other adaptations and combinations of features of the embodiments disclosed are within the scope of the present disclosure. Numerous embodiments are encompassed by the following claims.

What is claimed is:

1. A cooler for a memory module, comprising:
   a heat plate having a top edge and an interior side, the interior side for thermally coupling to an exterior side of the memory module; and
   a row of heat fins extending upward from the top edge, the heat fins being strips that are curved diagonally away from the heat plate and twisted so their free ends are substantially parallel to a simulated or an actual airflow about the memory module, wherein being curved diagonally away from the heat plate comprises being curved forward along a length of the heat plate and outward from the heat plate.

2. The cooler of claim 1, wherein the heat fins are arranged in increasing length along the top edge.

3. The cooler of claim 2, wherein the heat fins are further arranged in increasing diagonal reach along the top edge.

4. The cooler of claim 3, wherein the heat fins are arranged in increasing height along the top edge.

5. The cooler of claim 2, further comprising an other row of other heat fins in line with the row of heat fins along the top edge, the other heat fins extending upward from the top edge and curving along the length of the heat plate.

6. The cooler of claim 5, wherein the other heat fins are arranged in increasing height along the top edge.

7. The cooler of claim 6, wherein the other heat fins are laterally offset from each other along the top edge.

8. The cooler of claim 1, further comprising an adhesive on the interior side for mounting to the exterior side of the memory module.

9. The cooler of claim 2, further comprising:
   an other heat plate having an other top edge and an other interior side, the other interior side for thermally coupling to another exterior side of the memory module; and
   an other row of other heat fins extending upward from the other top edge and curving diagonally away from the other heat plate to be parallel with the heat fins.

10. A computer system, comprising:
    an enclosure;
    a printed circuit board in the enclosure, the printed circuit board comprising memory slots;
    memory modules inserted into the memory slots;
    coolers for the memory modules, each cooler comprising:

a first heat plate having a first top edge and a first interior side, the first interior side being thermally coupled to a first exterior side of a corresponding memory module;

a first row of first heat fins extending upward from the first top edge, the first heat fins being first strips that are curved diagonally away from the heat plate and twisted so their free ends are substantially parallel to a simulated or an actual airflow about the memory module, wherein being curved diagonally away from the heat plate comprises being curved forward along a length of the heat plate and outward from the heat plate;

a second heat plate having a second top edge and a second interior side, the second interior side being thermally coupled to a second exterior side of the corresponding memory module; and a second row of second heat fins extending upward from the second top edge, the second heat fins begin second strips that are curved and twisted to be parallel with the first heat fins.

11. The computer system of claim 10, wherein the free ends of the first and the second heat fins of each cooler are offset from each other so they do not block each other from the simulated or the actual airflow about the memory modules in the enclosure.

12. The computer system of claim 10, wherein each cooler further comprises:

a third row of third heat fins in line with the first row of first heat fins along the first top edge, the third heat fins extending upward from the first top edge and curving along the length of the first heat plate; and a fourth row of fourth heat fins in line with the second row of second heat fins along the second top edge, the fourth heat fins extending upward from the second top edge and curving along the length of the second heat plate.

13. A method for cooling memory modules on a printed circuit board in an enclosure, comprising:

determining airflow about the memory modules in the enclosure by simulation or testing; and adjusting heat fins extending upward from top edges of heat plates thermally coupled to sides of the memory modules, said adjusting comprises twisting and curving the heat fins so:

free ends of the heat fins are parallel to the airflow about the memory module in the enclosure;

the heat fins curve diagonally away from the top edges and into the airflow; and larger lateral surfaces of the heat fins bring air down to the memory modules.

14. The method of claim 13, wherein said adjusting comprises arranging the heat fins in increasing height along the top edge.

15. The method of claim 13, wherein the heat fins are arranged in increasing diagonal reach away from the heat plates.

16. The method of claim 13, wherein said adjusting further comprises offsetting the free ends so they do not block each other from the airflow about the memory modules in the enclosure.

* * * * *